(12) United States Patent
Takagi et al.

(10) Patent No.: US 11,630,389 B2
(45) Date of Patent: Apr. 18, 2023

(54) CURABLE COMPOSITION FOR IMPRINTING, REPLICA MOLD AND ITS PRODUCTION PROCESS

(71) Applicant: AGC Inc., Chiyoda-ku (JP)

(72) Inventors: Keisuke Takagi, Chiyoda-ku (JP); Tomoaki Sakurada, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 780 days.

(21) Appl. No.: 16/513,993

(22) Filed: Jul. 17, 2019

(65) Prior Publication Data

US 2019/0338062 A1    Nov. 7, 2019

Related U.S. Application Data

(63) Continuation of application No. PCT/JP2018/010300, filed on Mar. 15, 2018.

(30) Foreign Application Priority Data

Mar. 23, 2017  (JP) .............................. JP2017-056838

(51) Int. Cl.
  *C08F 267/06*      (2006.01)
  *C08F 220/68*      (2006.01)
  (Continued)

(52) U.S. Cl.
  CPC ........ *G03F 7/0002* (2013.01); *C08F 220/281* (2020.02); *C08F 220/68* (2013.01); *C08F 265/04* (2013.01); *C08F 267/06* (2013.01)

(58) Field of Classification Search
  None
  See application file for complete search history.

(56) References Cited

U.S. PATENT DOCUMENTS

| 2012/0231234 A1* | 9/2012 | Kodama | C08F 2/48 |
| | | | 522/108 |
| 2013/0049255 A1 | 2/2013 | Matsumoto et al. | |
| 2016/0017074 A1 | 1/2016 | Wada et al. | |

FOREIGN PATENT DOCUMENTS

| JP | 2012-134446 | 7/2012 |
| JP | 2013-245229 | 12/2013 |
| JP | 5794387 | 10/2015 |

OTHER PUBLICATIONS

International Search Report dated Jun. 19, 2018 in PCT/JP2018/010300 filed Mar. 15, 2018.

* cited by examiner

*Primary Examiner* — Robert J Grun
(74) *Attorney, Agent, or Firm* — Oblon, McClelland, Maier & Neustadt, L.L.P.

(57) ABSTRACT

To provide a curable composition for imprinting whereby a cured product layer for a replica mold, which is excellent in the adhesion to a mold substrate and the release property from a cured product of a transfer object material when used in an imprinting method is formed; a replica mold for imprinting, using the curable composition for imprinting; its production process and a process for producing an article having a fine pattern on its surface by using the replica mold. A curable composition for imprinting, which comprises a fluorinated polymer comprising structural units (a) based on $CH_2=C(R^1)C(O)OR^2R^f$ ($R^1$: a hydrogen atom, a methyl group or the like, $R^2$: a bivalent linking group having no fluorine atom and $R^f$: a $C_{2-6}$ fluoroalkyl group or the like) and structural units (b) having a cationic polymerizable reactive group having an oxygen atom, and a photo-acid generator, wherein the proportion of the fluorinated polymer is from 11 to 89 mass % in 100 mass % of the curable composition for imprinting.

15 Claims, 2 Drawing Sheets

(51) Int. Cl.
*C08F 220/28* (2006.01)
*C08F 265/04* (2006.01)
*G03F 7/00* (2006.01)

CURABLE COMPOSITION FOR IMPRINTING, REPLICA MOLD AND ITS PRODUCTION PROCESS

This application is a continuation of PCT Application No. PCT/JP2018/010300, filed on Mar. 15, 2018, which is based upon and claims the benefit of priority from Japanese Patent Application No. 2017-056838 filed on Mar. 23, 2017. The contents of those applications are incorporated herein by reference in their entireties.

TECHNICAL FIELD

The present invention relates to a curable composition for imprinting, a replica mold for imprinting and a process for its production and a process for producing an article having a fine pattern on its surface.

BACKGROUND ART

In the production of an optical member, a recording medium, a semiconductor device, etc., as a method for forming a fine pattern at a level of nano meter order in a short time, an imprinting method is known. The imprinting method is a method of pressing a mold having a fine pattern on its surface, on a transfer object material (curable composition) placed on a surface of a substrate and curing the transfer object material to form a cured product layer having the fine pattern transferred on its surface, on the surface of the substrate.

A master mold to be used in the imprinting method is very expensive, since a fine pattern is formed on a surface of silicon, quartz glass, a metal or the like by precision processing. Thus, a replica mold having a cured product layer having a surface on which a fine pattern of a master mold is transferred, on a surface of a mold substrate (glass, for example, quartz glass), is produced.

Patent Document 1 discloses, as a curable composition for forming a cured product layer for a replica mold, a resin mold material composition for imprinting, which contains per 100 parts by weight of a curable resin or a curable monomer, from 0.1 to 10 parts by weight of a curable fluorinated polymer (A) having structural units based on an a position-substituted acrylate having a $C_{4-6}$ fluoroalkyl group and structural units based on a crosslinking group-containing monomer having an epoxy group.

PRIOR ART DOCUMENTS

Patent Documents

Patent Document 1: Japanese Patent No. 5794387

DISCLOSURE OF INVENTION

Technical Problem

The cured product layer for a replica mold is required to have adhesion to a mold substrate and a release property from a cured product of a transfer object material when used in an imprinting method.

However, the cured product layer for a replica mold, which is made of the resin mold material composition described in Patent Document 1, is insufficient in the adhesion to a mold substrate and the release property from a cured product of a transfer object material when used in an imprinting method.

The present invention provides a curable composition for imprinting whereby a cured product layer for a replica mold, which is excellent in the adhesion to a mold substrate and the release property from a cured product of a transfer object material when used in an imprinting method is formed; a replica mold for imprinting, which is excellent in the adhesion of a cured product layer to a mold substrate and the release property from a cured product of a transfer object material when used in an imprinting method, its production process and a process for producing an article having a fine pattern on its surface by using the replica mold.

Solution to Problem

The present invention provides the following.
<1> A curable composition for imprinting, which comprises a fluorinated polymer comprising structural units (a) based on a monomer (I) represented by the following formula and structural units (b) having a cationic polymerizable reactive group having an oxygen atom (except the structural units (a)), and a photo-acid generator, wherein the proportion of the fluorinated polymer is from 11 to 89 mass % in 100 mass % of the curable composition for imprinting:

$$CH_2=C(R^1)C(O)OR^2R^f \qquad (I)$$

wherein $R^1$ is a hydrogen atom, a methyl group or a halogen atom, $R^2$ is a bivalent linking group having no fluorine atom, $R^f$ is a $C_{2-6}$ fluoroalkyl group or having an etheric oxygen atom between carbon atoms of a $C_{2-6}$ fluoroalkyl group, and in $R^f$, the carbon atom boned to $R^2$ has at least one fluorine atom.
<2> The curable composition for imprinting according to the above <1>, wherein the content of the structural units (b) is from 10 to 150 parts by mass, per 100 parts by mass of the structural units (a).
<3> The curable composition for imprinting according to the above <1> or <2>, wherein the fluorinated polymer has a mass average molecular weight of from 1,000 to 50,000.
<4> The curable composition for imprinting according to any one of the above <1> to <3>, wherein the fluorinated polymer further has structural units (c) having a pendant group having an ethylenic double bond.
<5> The curable composition for imprinting according to any one of the above <1> to <4>, which has a viscosity of at least 0.1 Pa·s at 25° C.
<6> The curable composition for imprinting according to any one of the above <1> to <5>, wherein the fluorinated polymer has a fluorine content of at least 22 mass %.
<7> The curable composition for imprinting according to any one of the above <1> to <6>, which has a fluorine content of at least 5 mass %.
<8> The curable composition for imprinting according to any one of the above <1> to <7>, wherein the curable composition for imprinting further contains a curable monomer, and the curable monomer includes a fluorinated monomer.
<9> The curable composition for imprinting according to the above <8>, wherein the curable monomer has a fluorine content of at least 1 mass %.
<10> A replica mold for imprinting, which comprises a mold substrate and a cured product layer having a fine pattern on its surface, formed on a surface of the mold substrate, wherein the cured product layer is made of a cured product of the curable composition for imprinting as defined in any one of the above <1> to <9>.

<11> The replica mold for imprinting according to the above <10>, wherein the mold substrate is made of glass.
<12> The replica mold for imprinting according to the above <10>, wherein the mold substrate is made of quartz glass.
<13> A process for producing the replica mold for imprinting as defined in any one of the above <10> to <12>, which comprises
sandwiching the curable composition for imprinting between a master mold having a fine pattern on its surface and the mold substrate so that the fine pattern of the master mold is in contact with the curable composition for imprinting,
curing the curable composition for imprinting to form a cured product layer, and separating the cured product layer from the master mold.
<14> A process for producing an article having a fine pattern on its surface, comprising a substrate and a cured product layer having a fine pattern on its surface, formed on a surface of the substrate, which comprises
sandwiching a transfer object material between the replica mold for imprinting as defined in any one of the above <10> to <12> and the substrate so that the fine pattern of the replica mold for imprinting is in contact with the transfer object material,
curing the transfer object material to form a cured product layer, and
separating the cured product layer from the replica mold for imprinting.

Advantageous Effects of Invention

According to the curable composition for imprinting of the present invention, a cured product layer for a replica mold, which is excellent in the adhesion to a mold substrate and the release property from a cured product of a transfer object material when used in an imprinting method, can be formed.

The replica mold of the present invention is excellent in the adhesion of a cured product layer to a mold substrate and the release property from a cured product of a transfer object material when used in an imprinting method.

According to the process for producing a replica mold of the present invention, a replica mold which is excellent in the adhesion of a cured product layer to a mold substrate and the release property from a cured product of a transfer object material when used in an imprinting method, can be produced.

According to the process for producing an article having a fine pattern on its surface of the present invention, in the replica mold for imprinting, peeling of a cured product layer from a mold substrate is suppressed, and the release property of the cured protect layer for the replica mold for imprinting from a cured product of transfer object material is excellent.

DESCRIPTION OF EMBODIMENTS

Figure 1:
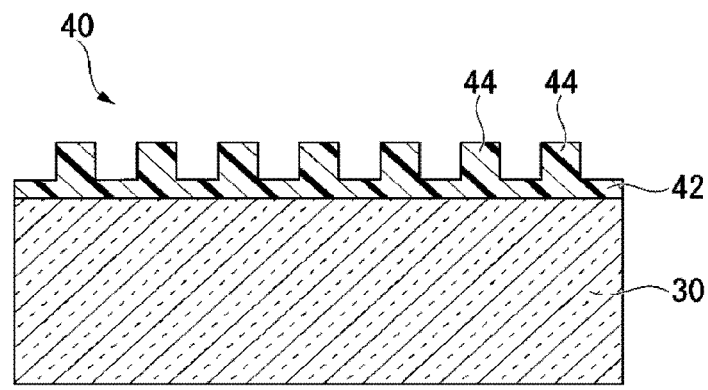
FIG. 1 is a schematic cross-sectional view illustrating one example of a replica mold for imprinting of the present invention.

The following definitions of terms are used throughout the present specification and the scope of claims.

The expression "to" is used to include numerical values before and after it as the lower limit value and the upper limit value, unless otherwise specified.

The size ratios in FIG. 1 to FIG. 4 are different from actual values for convenience sake for explanation.

"Monomer" means a compound to be structural units of a polymer. The monomer may be a compound having an ethylenic double bond or a compound having a group (such as a thiol group) reactive with an ethylenic double bond.

"Structural units" means units constituted by a monomer. The structural units may be units directly formed by the reaction of a monomer or may be units having a part of the units converted into other structure by treating the polymer.

"(Meth)acrylate" is a collective term of an acrylate and a methacrylate.

"Light" is a collective term of ultraviolet ray, visible light ray, infrared ray, electron beam and radiation.
<Curable Composition for Imprinting>

The curable composition for imprinting of the present invention comprises a specific fluorinated polymer (hereinafter referred to as "fluorinated polymer (A)") and a photoacid generator, may further contain a curable monomer and may further contain a photo radical polymerization initiator. As the case require, the curable composition for imprinting of the present invention may contain another component.

The curable composition for imprinting has a viscosity at 25° C. of preferably at least 0.1 Pa·s, more preferably at least 0.2 Pa·s, further preferably at least 1.0 Pa·s. Further, the above viscosity is preferably at most 15 Pa·s, more preferably at most 12 Pa·s. When the viscosity falls within the range of from 0.1 to 15 Pa·s, the curable composition for imprinting is easily brought into contact with a master mold without a specific operation (for example, an operation of heating the curable composition for imprinting at a high temperature so as to make the composition have a low viscosity). Further, the curable composition for imprinting can be easily applied on a surface of a mold substrate without flowing out from the surface of the mold substrate. Particularly, when forming a pattern having a thickness of at least 3 mm, a high viscosity is preferred so that a material will not flow out from a substrate, and the viscosity is preferably at least 1.0 Pa·s, preferably at least 2.0 Pa·s.

The curable composition for imprinting has a fluorine content of preferably at least 5 mass %, more preferably at least 10 mass %, further preferably at least 15 mass %. When the fluorine content is at least the above lower limit value, a cured product layer formed by curing the curable composition for imprinting has a sufficient release property from a cured product of a transfer object material. Further, the fluorine content is preferably at most 80 mass %, more preferably at most 60 mass %. When the fluorine content is at most the above upper limit value, deterioration of the adhesion to a mold substrate can be suppressed.
(Fluorinated Polymer (A))

The fluorinated polymer (A) has specific structural units (a) and specific structural units (b). The fluorinated polymer (A) preferably further has specific structural units (c). The fluorinated polymer (A) may further have structural units (d) other than the structural units (a), the structural units (b) and the structural units (c), as a case requires.

The structural units (a) are structural units based on a monomer (I) represented by the following formula.

The fluorinated polymer (A) has structural units (a), whereby a cured product layer comprising the fluorinated polymer (A) has a release property from a cured product of a transfer object material.

$$CH_2=C(R^1)C(O)OR^2R^f \quad (I)$$

wherein $R^1$ is a hydrogen atom, a methyl group or a halogen atom (such as a fluorine atom or a chlorine atom), $R^2$ is a bivalent linking group having no fluorine atom, $R^f$ is a $C_{2-6}$ fluoroalkyl group or a group having an etheric oxygen atom between carbon atoms of a $C_{2-6}$ fluoroalkyl group, and in $R^f$, the carbon atom bonded to $R^2$ has at least one fluorine atom.

$R^2$ is preferably an alkylene group, more preferably a $C_{1-3}$ alkylene group from the viewpoint of availability of the monomer (I).

$R^f$ is preferably a $C_{2-6}$ perfluoroalkyl group or a group having an etheric oxygen atom between carbon atoms of a $C_{2-6}$ perfluoroalkyl group, from the viewpoint of the release property. The number of carbon atoms of $R^f$ is preferably from 4 to 6, particularly preferably 6 from the viewpoint of the release property, and at most 6 with a view to reducing environment burden.

Here, the etheric oxygen atom contained between carbon atoms of $R^f$ may be one or plural.

The monomer (I) may, for example, be the following compound.

$CH_2C(CH_3)C(O)O(CH_2)_2(CF_2)_2F$,
$CH_2=C(CH_3)C(O)O(CH_2)_2(CF_2)_3F$,
$CH_2=C(CH_3)C(O)O(CH_2)_2(CF_2)_4F$,
$CH_2=C(CH_3)C(O)O(CH_2)_2(CF_2)_5F$,
$CH_2=C(CH_3)C(O)O(CH_2)_2(CF_2)_6F$,
$CH_2=C(CH_3)C(O)OCH_2CF(CF_3)OCF_2CF_2CF_3$,
$CH_2=C(CH_3)C(O)OCH_2CF_2OCF_2CF_2OCF_3$,
$CH_2=C(CH_3)C(O)OCH_2CF_2OCF_2CF_2OCF_2CF_3$,
$CH_2=C(CH_3)C(O)OCH_2CF_2OCF_2CF_2OCF_2CF_2OCF_3$,
$CH_2=CHC(O)O(CH_2)_2(CF_2)_2F$,
$CH_2=CHC(O)O(CH_2)_2(CF_2)_3F$,
$CH_2=CHC(O)O(CH_2)_2(CF_2)_4F$,
$CH_2=CHC(O)O(CH_2)_2(CF_2)_5F$,
$CH_2=CHC(O)O(CH_2)_2(CF_2)_6F$,
$CH_2=CHC(O)OCH_2CF(CF_3)OCF_2CF_2CF_3$,
$CH_2=CHC(O)OCH_2CF_2OCF_2CF_2OCF_3$,
$CH_2=CHC(O)OCH_2CF_2OCF_2CF_2OCF_2CF_3$,
$CH_2=CHC(O)OCH_2CF_2OCF_2CF_2OCF_2CF_2OCF_3$,
$CH_2=C(Cl)C(O)O(CH_2)_2(CF_2)_2F$,
$CH_2=C(Cl)C(O)O(CH_2)_2(CF_2)_3F$,
$CH_2=C(Cl)C(O)O(CH_2)_2(CF_2)_4F$,
$CH_2=C(Cl)C(O)O(CH_2)_2(CF_2)_5F$,
$CH_2=C(Cl)C(O)O(CH_2)_2(CF_2)_6F$ or the like.

As the monomer (I), one type may be used alone, or two or more types may be used in combination.

The structural units (b) are structural units (except the structural units (a)) having a cationic polymerizable reactive group having an oxygen atom.

The fluorinated polymer (A) has structural units (b), whereby a cured product layer comprising the fluorinated polymer (A) has an adhesion to a mold substrate.

That is, an acid is generated from a photo-acid generator by light exposure, whereby the cationic polymerizable reactive group having an oxygen atom in the structural units (b) reacts to a reactive group (such as a hydroxy group) on a surface of the mold substrate, and the cured product layer comprising the fluorinated polymer (A) thereby chemically bonds to the mold substrate.

The cationic polymerizable reactive group having an oxygen atom may, for example, be a cyclic ether or a vinyl ether and is preferably a cyclic ether from the viewpoint of a high reactivity and with a view to forming a bond immediately.

The cyclic ether may, for example, be an epoxy group, an oxetane group or a 3,4-epoxycyclohexyl group. The vinyl ether may, for example, be a vinyloxy group.

As specific examples of the structural units (b), structural units based on a monomer (II) having a cationic polymerizable reactive group having an oxygen atom may be mentioned.

The monomer (II) may, for example, be a glycidyl (meth)acrylate, a (3-ethyloxetan-3-yl)methyl (meth)acrylate, 4-hydroxybutyl (meth)acrylate glycidyl ether or 3,4-epoxycyclohexylmethyl (meth)acrylate. As the monomer (II), one type may be used alone, or two or more types may be used in combination.

The structural units (c) are structural units having an ethylenic double bond in a pendant group.

The fluorinated polymer (A) has the structural units (c), whereby the curing property of a curable composition for imprinting, which comprises the fluorinated polymer (A), is improved.

For example, the structural units (c) may be formed by reacting structural units (c') based on a monomer (III') having a first reactive group with a monomer (X) having an ethylenic double bond and a second reactive group reactive with the first reactive group.

The first reactive group may, for example, be a hydroxy group, a carboxy group or an amino group.

The second reactive group may, for example, be an isocyanate group, a carboxy group or an acid chloride group.

The monomer (III') may, for example be a (meth)acrylate having a hydroxy group, a compound having a hydroxy group and an ethylenic double bond (except a (meth)acrylate), a (meth)acrylate having a carboxy group, a compound having a carboxy group and an ethylenic double bond (except a (meth)acrylate), a compound having a hydroxy group and a thiol group, a compound having a carboxy group and a thiol group, a compound having an amino group and an ethylenic double bond or a compound having a thiol group, an amino group and a carboxy group.

The (meth)acrylate having a hydroxy group may, for example, be 2-hydroxyethyl (meth)acrylate, 2-hydroxypropyl (meth)acrylate, 2-hydroxybutyl (meth)acrylate or 4-hydroxybutyl (meth)acrylate.

The compound having a hydroxy group and an ethylenic double bond may, for example, be N-(hydroxymethyl) (meth)acrylamide or N-(hydroxyethyl) (meth)acrylamide.

The (meth)acrylate having a carboxy group may, for example, be (meth)acrylic acid, β-carboxyethyl (meth)acrylate, mono(2-(meth)acryloyloxyethyl) succinate, mono(2-(meth)acryloyloxyethyl) phthalate, mono(2-(meth)acryloyloxyethyl) hexahydrophthalate or mono(2-(meth)acryloyloxyethyl-2-hydroxyethyl) phthalate.

The compound having a carboxy group and an ethylenic double bond may, for example, be 6-acrylamidohexanoic acid.

The compound having a hydroxy group and a thiol group may, for example, be 2-mercaptoethanol, 3-mercapto-1-propanol, α-thioglycerol, 2,3-dimercapto-1-propanol or 6-mercapto-1-hexanol.

The compound having a carboxy group and a thiol group may, for example, be thioglycolic acid, thiolactic acid, thiomalic acid, 3-mercaptoisobutyric acid, 1-(mercaptomethyl)cyclopropanoic acid, 3-mercaptobenzoic acid or 4-mercaptobenzoic acid.

The compound having an amino group and an ethylenic double bond may, for example, be (meth)acrylamide.

The compound having a thiol group, an amino group and a carboxy group may, for example, be L-cysteine.

As the monomer (III'), one type may be used alone, or two or more types may be used in combination.

The monomer (X) may, for example, be a (meth)acrylate having an isocyanate group, a (meth)acrylate having a carboxy group or a monomer having an acid chloride group.

The (meth)acrylate having an isocyanate group may, for example, be methacryloyloxyethyl isocyanate (Karenz MOI (trade name), manufactured by Showa Denko K.K.), acryloyloxyethyl isocyanate (Karenz AOI (trade name), manufactured by Showa Denko K.K.), 1,1-(bisacryloyloxymethyl)ethyl isocyanate (Karenz MOI-BEI (trade name), manufactured by Showa Denko K.K.) or methacryloyloxyethoxyethyl isocyanate (Karenz MOI-EG (trade name), manufactured by Showa Denko K.K.).

The (meth)acrylate having a carboxy group may, for example, be a (meth)acrylic acid, 3-carboxyethyl (meth) acrylate, mono(2-(meth)acryloyloxyethyl) succinate, mono (2-(meth)acryloyloxyethyl) phthalate, mono(2-(meth)acryloyloxyethyl) hexahydrophthalate or mono(2-(meth) acryloyloxyethyl-2-hydroxyethyl) phthalate.

The monomer having an acid chloride group may, for example, be acryloyl chloride or methacryloyl chloride.

As the monomer (X), one type may be used alone, or two or more types may be used in combination.

The structural units (d) are structural units other than the structural units (a), the structural units (b) and the structural units (c). Structural units (c') remaining without reacting with the monomer (X) are included in the structural units (d).

The structural units (d) may be structural units based on a monomer (IV) other than the monomer (I) and the monomer (II).

The monomer (IV) may, for example, be methyl (meth) acrylate, ethyl (meth)acrylate, propyl (meth)acrylate, n-butyl (meth)acrylate, an isobutyl (meth)acrylate, tert-butyl (meth)acrylate, hexyl (meth)acrylate, cyclohexyl (meth) acrylate, 2-ethylhexyl (meth)acrylate, octyl (meth)acrylate, decyl (meth)acrylate, isodecyl (meth)acrylate, lauryl (meth) acrylate, stearyl (meth)acrylate, benzyl (meth)acrylate, isobornyl (meth)acrylate, dicyclopentanyl (meth)acrylate, adamantyl (meth)acrylate or dimethylaminoethyl (meth) acrylate.

As the monomer (IV), one type may be used alone, or two or more types may be used in combination.

The fluorinated polymer (A) has a fluorine content of preferably at least 22 mass %, more preferably at least 25 mass %, further preferably at least 30 mass %. When the fluorine content is at least the above lower limit value, a cured product layer comprising the fluorinated polymer (A) has a sufficient release property from a cured product of a transfer object material. The fluorine content is preferably at most 75 mass %, more preferably at most 50 mass %. When the fluorine content is at most the above upper limit value, the fluorinated polymer (A) has a good compatibility with another component in the curable composition for imprinting.

The proportion of the structural units (a) in all structural units of the fluorinated polymer (A) is appropriately controlled so that the fluorinated polymer (A) will have the fluorine content within the above range.

The content of the structural units (b) is preferably from 10 to 150 parts by mass per 100 parts by mass of the structural units (a). When the content of the structural units (b) is at least 10 parts by mass, a cured product layer comprising the fluorinated polymer (A) has a sufficient adhesion to a mold substrate. The content of the structural units (b) is more preferably at least 20 parts by mass, further preferably at least 30 parts by mass. On the other hand, when the content of the structural units (b) is at most 150 parts by mass, effects by other structural units are less likely to be impaired. The content of the structural units (b) is more preferably at most 120 parts by mass, further preferably at most 100 parts by mass.

In a case where the fluorinated polymer (A) contains structural units (c), the content of the structural units (c) is preferably from 10 to 200 parts by mass per 100 parts by mass of the structural units (a). When the content of the structural units (c) is at least 10 parts by mass, a curable composition for imprinting which comprises the fluorinated polymer (A) will be further improved. The content of the structural units (c) is more preferably at least 20 parts by mass, further preferably at least 30 parts by mass, still more preferably at least 60 parts by mass. On the other hand, the content of the structural units (c) is more preferably at most 180 parts by mass, further preferably at most 150 parts by mass, still more preferably at most 120 parts by mass.

The content of the structural units (d) is preferably from 0 to 30 parts by mass, more preferably from 0 to 20 parts by mass, further preferably from 0 to 10 parts by mass, per 100 parts by mass of the structural units (a). When the proportion of the structural units (d) is at most the upper limit value of the above range, effects by the other structural units are less likely to be impaired.

The proportions of the respective structural units in the fluorinated polymer (A) may, for example, be obtained from the mass ratios of the respective monomers used for producing the fluorinated polymer (A).

The fluorinated polymer (A) preferably has a mass average molecular weight of from 1,000 to 50,000. The mass average molecular weight is more preferably at least 1,500, further preferably at least 2,000. On the other hand, the mass average molecular weight is preferably at most 40,000, further preferably at most 30,000.

When the mass average molecular weight falls within the above range, the fluorinated polymer (A) is likely to be located at a surface of the cured product layer. As a result, the cured product layer comprising the fluorinated polymer (A) has a sufficient release property from a cured product of a transfer object material.

The fluorinated polymer (A) may be produced by a known polymerization method such as a solution polymerization method, a bulk polymerization method or an emulsion polymerization method. The polymerization method is preferably a solution polymerization method.

(Photo-Acid Generator)

The photo-acid generator may be a compound which generates an acid by light irradiation.

The photo-acid generator may, for example, be a triaryl sulfonium salt, a diaryl iodonium salt or a sulfonyldiazomethane.

As specific examples of a cation portion of the triaryl sulfonium salt or the diaryl iodonium salt, triphenyl sulfonium, diphenyl-4-methylphenyl sulfonium, tris(4-methylphenyl) sulfonium, diphenyl-2,4,6-trimethylphenyl sulfonium, diphenyl iodonium, 4-isopropyl-4'-methyldiphenyl iodonium, 4-methyl-4'-methylpropyldiphenyl iodonium, bis (4-tert-butylphenyl) iodonium and 4-methoxyphenylphenyl iodonium may be mentioned.

As specific examples of an anion portion of the triaryl sulfonium salt and the diaryl iodonium salt, trifluoromethanesulfonate, nonafluorobutanesulfonate, hexafluorophosphate, tetrafluoroborate, tris(pentafluoroethyl)trifluorophosphate, tris(heptafluoropropyl)trifluorophosphate, tris(nonafluoroisobutyl)trifluorophosphate and bis(nonafluoroisobutyl)tetrafluorophosphate may be mentioned.

As specific examples of the sulfonyldiazomethane, bis(phenylsulfonyl)diazomethane, bis(tert-butylsulfonyl)diazomethane, bis(cyclohexylsulfonyl)diazomethane and bis(p-toluenesulfonyl)diazomethane may be mentioned.

(Curable Monomer)

The curable monomer is a compound having at least one ethylenic double bond.

When the curable composition for imprinting contains a curable monomer, the curable composition for imprinting has a good curability.

The curable monomer preferably includes a fluorinated monomer, whereby a cured product layer formed by curing the curable composition for imprinting has a sufficient release property from a cured product of a transfer object material, and the compatibility of the curable monomer and the fluorinated polymer (A) is good.

The curable monomer may contain a non-fluorinated monomer having no fluorine atom.

The fluorinated monomer is preferably a fluoro(meth)acrylate from the viewpoint of the compatibility. The fluoro(meth)acrylate may, for example, be the following compounds.

$CH_2$=$CHC(O)OCH(CF_3)_2$,
$CH_2$=$C(CH_3)C(O)OCH(CF_3)_2$,
$CH_2$=$CHC(O)O(CH_2)_2(CF_2)_4F$,
$CH_2$=$CHC(O)O(CH_2)_2(CF_2)_5F$,
$CH_2$=$CHC(O)O(CH_2)_2(CF_2)_6F$,
$CH_2$=$C(CH_3)C(O)O(CH_2)_2(CF_2)_4F$,
$CH_2$=$C(CH_3)C(O)O(CH_2)_2(CF_2)_5F$,
$CH_2$=$C(CH_3)C(O)O(CH_2)_2(CF_2)_6F$,
$CH_2$=$CHC(O)OCH_2(CF_2)_6F$,
$CH_2$=$C(CH_3)C(O)OCH_2(CF_2)_6F$,
$CH_2$=$CHC(O)OCH_2CF_2CF_2H$,
$CH_2$=$CHC(O)OCH_2(CF_2CF_2)_2H$,
$CH_2$=$C(CH_3)C(O)OCH_2CF_2CF_2H$,
$CH_2$=$C(CH_3)C(O)OCH_2(CF_2CF_2)_2H$,
$CH_2$=$CHC(O)OCH_2CF_2OCF_2CF_2OCF_3$,
$CH_2$=$CHC(O)OCH_2CF_2O(CF_2CF_2O)_3CF_3$,
$CH_2$=$C(CH_3)C(O)OCH_2CF_2OCF_2CF_2OCF_3$,
$CH_2$=$C(CH_3)C(O)OCH_2CF_2O(CF_2CF_2O)_3CF_3$,
$CH_2$=$CHC(O)OCH_2CF(CF_3)OCF_2CF(CF_3)O(CF_2)_3F$,
$CH_2$=$CHC(O)OCH_2CF(CF_3)O(CF_2CF(CF_3)O)_2(CF_2)_3F$,
$CH_2$=$C(CH_3)C(O)OCH_2CF(CF_3)OCF_2CF(CF_3)O(CF_2)_3F$,
$CH_2$=$C(CH_3)C(O)OCH_2CF(CF_3)O(CF_2CF(CF_3)O)_2(CF_2)_3F$,
$CH_2$=$CHC(O)OCH_2CH(OH)CH_2CF_2CF_2CF(CF_3)_2$,
$CH_2$=$C(CH_3)C(O)OCH_2CH(OH)CH_2CF_2CF_2CF(CF_3)_2$,
$CH_2$=$CHC(O)OCH_2CF_2(OCF_2CF_2)_pOCF_2CH_2OC(O)CH$=$CH_2$ (p is an integer of from 1 to 20),
$CH_2$=$C(CH_3)C(O)OCH_2CF_2(OCF_2CF_2)_pOCF_2CH_2OC(O)C(CH_3)$=$CH_2$ (p is an integer of from 1 to 20),
$CH_2$=$CHC(O)OCH_2(CF_2)_4CH_2OC(O)CH$=$CH_2$,
$CH_2$=$C(CH_3)C(O)OCH_2(CF_2)_4CH_2OC(O)C(CH_3)$=$CH_2$,
$CH_2$=$CHC(O)OCH_2(CF_2)_6CH_2OC(O)CH$=$CH_2$,
$CH_2$=$C(CH_3)C(O)OCH_2(CF_2)_6CH_2OC(O)C(CH_3)$=$CH_2$,
$CH_2$=$CHC(O)OCH_2(CF_2)_8CH_2OC(O)CH$=$CH_2$,
$CH_2$=$C(CH_3)C(O)OCH_2(CF_2)_8CH_2OC(O)C(CH_3)$=$CH_2$,
$CH_2$=$CHC(O)O(CH_2)_2(CF_2)_6(CH_2)_2OC(O)CH$=$CH_2$,
$CH_2$=$C(CH_3)C(O)O(CH_2)_2(CF_2)_6(CH_2)_2OC(O)C(CH_3)$=$CH_2$, etc.

As the fluorinated monomer, one type may be used alone, or two or more types may be used in combination.

The non-fluorinated monomer may, for example, be the following compound. 2-ethylhexyl (meth)acrylate, n-butyl (meth)acrylate, tert-butyl (meth)acrylate, ethoxyethyl (meth)acrylate, methoxyethyl (meth)acrylate, allyl (meth)acrylate, 2-hydroxyethyl (meth)acrylate, 2-hydroxypropyl (meth)acrylate, octyl (meth)acrylate, decyl (meth)acrylate, behenyl (meth)acrylate, stearyl (meth)acrylate, isostearyl (meth)acrylate, lauryl (meth)acrylate, glycidyl (meth)acrylate, tetrahydrofurfuryl (meth)acrylate, 2-methyl-2-adamantyl (meth)acrylate, 2-ethyl-2-adamantyl (meth)acrylate, 3-hydroxy-1-adamantyl (meth)acrylate, 1-adamantyl (meth)acrylate, isobornyl (meth)acrylate, 4-tert-butylcyclohexyl (meth)acrylate, 3-(trimethoxysilyl)propyl (meth)acrylate, N,N-diethylaminoethyl (meth)acrylate, N,N-dimethylaminoethyl (meth)acrylate, 2-(tert-butylamino)ethyl (meth)acrylate, methoxytriethylene glycol (meth)acrylate, methoxypolyethylene glycol (meth)acrylate, 2-(meth)acryloyloxyethylhexahydrophthalic acid, 2-(meth)acryloyloxyethylsuccinic acid, 1,2,2,6,6-pentamethyl-4-piperidyl (meth)acrylate, phenoxyethyl (meth)acrylate, 2-hydroxy-3-phenoxypropyl (meth)acrylate, phenoxyethylene glycol (meth)acrylate, phenoxydiethylene glycol (meth)acrylate, benzyl (meth)acrylate, 2-naphthyl (meth)acrylate, 2-hydroxy-3-phenoxypropyl (meth)acrylate, 2-(4-benzoyl-3-hydroxyphenoxy)ethyl (meth)acrylate, 9-anthracenyl (meth)acrylate, fluorescein o-(meth)acrylate, 2-(9H-carbazol-9-yl)ethyl (meth)acrylate, zirconium (meth)acrylate, β-carboxyethyl (meth)acrylate, a polyethylene glycol di(meth)acrylate (such as ethylene glycol di(meth)acrylate, diethylene glycol di(meth)acrylate or tetraethylene glycol di(meth)acrylate), a polypropylene glycol di(meth)acrylate (such as dipropylene glycol di(meth)acrylate), 1,3-butanediol di(meth)acrylate, 1,4-butanediol di(meth)acrylate, glycerol 1,3-diglycerolate di(meth)acrylate, 1,6-hexanediolethoxylate di(meth)acrylate, 1,6-hexanediolpropoxylate di(meth)acrylate, 1,6-hexanediol di(meth)acrylate, 3-hydroxy-2,2-dimethylpropionate di(meth)acrylate, 1,9-nonanediol di(meth)acrylate, 1,10-decanediol di(meth)acrylate, neopentyl glycol di(meth)acrylate, neopentyl glycol propoxylate di(meth)acrylate, glycerol di(meth)acrylate, propylene glycol glycerolate di(meth)acrylate, tripropylene glycol di(meth)acrylate, triethylene glycol di(meth)acrylate, tetraethylene glycol di(meth)acrylate, tripropylene glycol glycerolate di(meth)acrylate, 2-hydroxy-3-acryloyloxypropyl (meth)acrylate, 2-methyl-1,3-propanediol diacrylate, tricyclodecanedimethanol diacrylate, trimethylolpropane tri(meth)acrylate, trimethylolpropane ethoxy tri(meth)acrylate, ethoxylated trimethylolpropane triacrylate, propoxylated trimethylolpropane triacrylate, 1,3-bis(3-methacryloyloxypropyl)-1,1,3,3-tetramethyldisiloxane, glycerinpropoxy tri(meth)acrylate, pentaerythritol di(meth)acrylate monostearic acid, trimethylolpropane ethoxylate methyl ether di(meth)acrylate, pentaerythritol tri(meth)acrylate, pentaerythritol tetra(meth)acrylate, pentaerythritol ethoxytetra (meth)acrylate, ditrimethylolpropane tetra(meth)acrylate, propoxylated pentaerythritoltetraacrylate, dipentaerythritolhexa(meth)acrylate, a urethane acrylate, etc.

As the non-fluorinated monomer, one type may be used alone, or two or more types may be used in combination.

The curable monomer has a fluorine content of preferably at least 1 mass %, more preferably at least 3 mass %, further preferably at least 5 mass %, still more preferably at least 10 mass %. When the fluorine content is at least the above lower limit value, a cured product layer formed by curing the curable composition for imprinting has a sufficient release property from a cured product of a transfer object material, and the compatibility of the curable monomer and the fluorinated polymer (A) in the curable composition for imprinting is good. Further, the fluorine content is preferably at most 80 mass %, more preferably at most 75 mass %, further preferably at most 50 mass %. When the fluorine content is at most the above upper limit value, in the curable composition for imprinting, the curable monomer has good compatibility with components other than the fluorinated polymer (A).

When the fluorine content of the curable monomer is at least the above lower limit value, the compatibility with the fluorinated polymer (A) simultaneously having a fluorine atom is good. If the compatibility of the curable monomer and the fluorinated polymer (A) is good, the proportion of the fluorinated polymer (A) in the curable composition for imprinting can be increased (can be at least 11 mass %), whereby a cured product layer for a replica mold, which is further excellent in the adhesion to a mold substrate and the release property from a cured product of a transfer object material when used in an imprinting method, can be formed.

On the other hand, in the resin mold material composition for imprinting described in Patent Document 1, the curable monomer is a usual curable monomer, and the compatibility of the curable monomer and a curable fluorinated polymer (A) is thereby poor. Thus, the proportion of the curable fluorinated polymer (A) cannot be increased (has to be at most 10 mass %). Thus, a cured product layer for a replica mold, which is made of the resin mold material composition described in Patent Document 1 is poor in the adhesion to a mold substrate and the release property from a cured product of a transfer object material when used in an imprinting method.

(Photo Radical Polymerization Initiator)

The photo radical polymerization initiator is a compound which generates radicals by absorbing light. When the curable composition for imprinting contains a photo radical polymerization initiator, a cured product can be easily formed by light irradiation.

The photo radical polymerization initiator may, for example, be an alkylphenone type, an acylphosphine oxide type, a titanocene type, an oxime ester type, an oxyphenylacetate type, a benzoin type, a benzophenone type or a thioxanthone type photopolymerization initiator and may, for example, be benzyl-(o-ethoxycarbonyl)-α-monooxime, glyoxylate, 3-ketocoumarin, 2-ethylanthraquinone, camphorquinone, tetramethylthiuramsulfide, azobisisobutyronitrile, benzoyl peroxide, dialkyl peroxide or tert-butyl peroxypivalate. From the viewpoint of the sensitivity and compatibility, an alkylphenone type, an acylphosphine oxide type, a benzoin type or a benzophenone type photopolymerization initiator is preferred.

As the photo radical polymerization initiator, one type may be used alone, or two or more types may be used in combination.

(Another Component)

Another component may, for example, be a surfactant, an antioxidant (thermal stabilizer), a thixotropic agent, an antifoaming agent, a lightproof stabilizing agent, an antigelling agent, a photosensitizer, a resin, a resin oligomer, a carbon compound, fine metal particles, fine metal oxide particles, a silane coupling agent or another organic compound.

(Solvent)

The curable composition for imprinting of the present invention may contain a solvent. However, the solvent is preferably removed before curing the curable composition for imprinting.

As the solvent, any solvent may be used, so long as the fluorinated polymer (A), the photo-acid generator, the curable monomer and the photo radical polymerization initiator can be dissolved, and a solvent having at least one of an ester structure, a ketone structure, a hydroxy group and an ether structure is preferred.

In a case where the solvent is used, the content of the solvent in the curable composition for imprinting can be appropriately adjusted depending on the desired viscosity, the coating property, the desired film thickness, etc.

(Proportions of the Respective Components in the Curable Composition for Imprinting)

The proportion of the fluorinated polymer (A) is from 11 to 89 mass % in 100 mass % of the curable composition for imprinting (excluding the solvent). The proportion of the fluorinated polymer (A) is at least 11 mass %, preferably at least 15 mass %, further preferably at least 19 mass %, whereby a cured product layer for a replica mold, which is excellent in the adhesion to a mold substrate and the release property from a cured product of a transfer object material when used in an imprinting method, can be formed. On the other hand, the proportion of the fluorinated polymer (A) is at most 89 mass %, preferably at most 86 mass %, further preferably at most 83 mass %, whereby the compatibility with other components is good, and effects by other components are less likely to be impaired.

The proportion of the photo-acid generator is preferably from 0.01 to 7 mass % in 100 mass % of the curable composition for imprinting (excluding the solvent). The proportion of the photo-acid generator is preferably at least 0.01 mass %, more preferably at least 0.05 mass %, further preferably at least 0.1 mass %, whereby a cured product layer for a replica mold, which is further excellent in the adhesion to a mold substrate can be formed. On the other hand, the proportion of the photo-acid generator is preferably at most 7 mass %, more preferably at most 5 mass %, further preferably at most 3 mass %, whereby a residual photo-acid generator in a cured product layer is less, and the deterioration of physical properties of the cured product layer is suppressed.

The proportion of the curable monomer is preferably from 0 to 88 mass % in 100 mass % of the curable composition for imprinting (excluding the solvent). The proportion of the curable monomer is preferably higher than 0 mass %, more preferably at least 3 mass %, further preferably at least 8 mass %, whereby the curing property of the curable composition for imprinting is further improved. On the other hand, the proportion of the curable monomer is at most 88 mass %, more preferably at most 84 mass %, further preferably at most 80 mass %, whereby effects by other components are less likely to be impaired.

The proportion of the photo radical polymerization initiator is preferably from 0.01 to 7 mass % in 100 mass % of the curable composition for imprinting (excluding the solvent). The proportion of the photo radical polymerization initiator is preferably at least 0.01 mass %, more preferably at least 0.05 mass %, further preferably at least 0.1 mass %, whereby the curing property of the curable composition for imprinting is further improved. On the other hand, the proportion of the photo radical polymerization initiator is at most 7 mass %, more preferably at most 5 mass %, further preferably at most 3 mass %, whereby a residual photo radical polymerization initiator in a cured product layer is less, and the deterioration of physical properties of the cured product layer is suppressed.

The total proportion of other components is preferably from 0 to 10 mass %, more preferably from 0 to 7 mass %, further preferably from 0 to 5 mass % in 100 mass % of the curable composition for imprinting (excluding the solvent).

The above-described curable composition for imprinting of the present invention comprises at least 11 mass % of the fluorinated polymer (A) having the structural units (a) having a fluorine atom, whereby a cured product layer for a replica mold, which is excellent in the release property from a cured product of a transfer object material when used in an imprinting method, can be formed.

Further, the curable composition for imprinting of the present invention contains at least 11 mass % of the fluorinated polymer (A) having structural units (b) having a cationic polymerizable reactive group having an oxygen atom and contains the photo-acid generator, whereby a cured product layer for a replica mold, which is excellent in the adhesion to a mold substrate, can be formed. That is, the cationic polymerizable reactive group having an oxygen atom in the structural units (b) reacts with a reactive group on a surface of a mold substrate by an acid generated from the photo-acid generator by light exposure, and the cured product layer comprising the fluorinated polymer (A) thereby chemically bonds to the mold substrate. As a result, the adhesion between the cured product layer and the mold substrate is exhibited.

<Replica Mold for Imprinting>

The replica mold for imprinting of the present invention comprises a mold substrate and a cured product layer having a fine pattern on its surface, formed on a surface of the mold substrate, and the cured product layer is made of a cured product of the curable composition for imprinting of the present invention.

FIG. 1 is a schematic cross-sectional view illustrating one example of the replica mold for imprinting of the present invention.

A replica mold 40 for imprinting has a mold substrate 30 and a cured product layer 42 having a fine pattern 44 on its surface, formed as the outermost layer on a surface of the mold substrate 30.

(Mold Substrate)

The mold substrate may be a substrate made of an inorganic material or a substrate made of an organic material.

The inorganic material may, for example, be glass (including tempered glass, glass ceramics and quartz glass), silicon wafer, a metal (such as aluminum, nickel or copper), a metal oxide (such as sapphire or indium tin oxide (ITO)), silicon nitride, aluminum nitride or lithium niobate.

The organic material may, for example, be a fluororesin, a silicone resin, an acrylic resin, a polycarbonate, a polyester (such as a polyethylene terephthalate), a polyamide, a polyimide, a polypropylene, a polyethylene, a nylon resin, a polyphenylene sulfide, triacetyl cellulose or a cyclic polyolefin.

The mold substrate is preferably glass from the viewpoint of transparency, surface flatness and optical isotropy, and from the viewpoint of the excellent adhesion to the cured product layer, a substrate which is surface-treated may be used. The surface treatment may, for example, be UV ozone treatment or plasma etching treatment.

(Cured Product Layer)

The cured product layer is a layer made of a cured product of the curable composition for imprinting.

The cured product layer has a fine pattern having either or both of plural convexes and plural concaves on its surface. The fine pattern is a reversed pattern corresponding to a fine pattern of the after-mentioned master mold.

The convexes may, for example, be long convex stripes extending on the surface of the cured product layer or protrusions dotted on the surface. The concaves may, for example, be long grooves extending on the surface of the cured product layer or pores dotted on the surface.

The shape of the convex stripes or grooves may, for example, be a linear, curved or bent shape. The convex stripes or the grooves may be in the form of plural stripes present in parallel with one another or without crossing.

The cross-sectional shape in a direction perpendicular to the longitudinal direction of the convex stripes or the grooves may, for example, be rectangular, trapezoidal, triangular or semicircular.

The shape of the protrusions or the pores may, for example, be a triangle pole, a square pole, a hexagonal pole, a cylinder, a triangular pyramid, a quadrangular pyramid, a hexagonal pyramid, a cone, a hemisphere or a polyhedron.

The width of the convex stripes or the grooves is preferably from 1 nm to 500 µm, more preferably from 10 nm to 100 µm, further preferably from 15 nm to 10 µm. The width of the convex stripes means the length of the base in the cross section in a direction perpendicular to the longitudinal direction. The width of the grooves means the length of the upper side in the cross section in a direction perpendicular to the longitudinal direction.

The width of the protrusions or the pores is preferably from 1 nm to 500 µm, more preferably from 10 nm to 100 µm, further preferably from 15 nm to 10 µm. The width of the protrusions means the length of the base in the cross section in a direction perpendicular to the longitudinal direction in a case where the base is slender, and in other cases, means the maximum length at the base of each protrusion. The width of the pores means the length of the upper side in the cross section in a direction perpendicular to the longitudinal direction in a case where the opening is slender, and in other cases, means the maximum length at the opening of each pore.

The height of the convexes is preferably from 1 nm to 500 µm, more preferably from 10 nm to 100 µm, further preferably from 15 nm to 10 µm.

The depth of the concaves is preferably from 1 nm to 500 µm, more preferably from 10 nm to 100 µm, further preferably from 15 nm to 10 µm.

In a region where the fine patterns are dense, the pitch (center-to-center distance) between the adjacent convexes (or concaves) is preferably from 1 nm to 500 µm, more preferably from 10 nm to 100 µm, further preferably from 15 nm to 10 µm.

The above-described replica mold for imprinting of the present invention has a cured product layer made of a cured product of the curable composition for imprinting of the present invention, whereby the adhesion of the cured product layer to a mold substrate and the release property from a cured product of a transfer object material when used in an imprinting method are excellent.

<Process for Producing Replica Mold>

The process for producing a replica mold of the present invention has the following steps (a) to (c).

Figure 2:
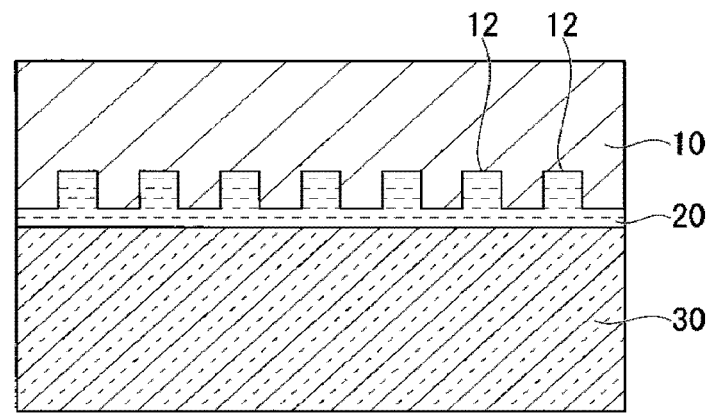
FIG. 2 is a schematic cross-sectional view illustrating one example of a process for producing a replica mold for imprinting of the present invention.

Step (a): A step of sandwiching a curable composition for imprinting 20 between a master mold 10 having a fine pattern 12 on its surface and a mold substrate 30 so that the fine pattern 12 of the master mold 10 is in contact with the curable composition for imprinting 20, as illustrated in FIG. 2.

Step (b): A step of curing the curable composition for imprinting 20 to form a cured product layer.

Step (c): A step of separating the cured product layer from the master mold.

(Master Mold)

The master mold has a fine pattern on its surface. The fine pattern is a reversed pattern corresponding to the fine pattern of the replica mold.

As the master mold, a mold made of a non-translucent material or a mold made of a translucent material may be mentioned.

The mold made of a non-translucent material may, for example, be silicon wafer, nickel, copper, stainless steel, titanium, SiC or mica.

The mold made of a translucent material may, for example, be glass such as quartz glass, a polydimethylsiloxane, a cyclic polyolefin, a polycarbonate, a polyethylene terephthalate or a transparent fluororesin. The mold made of a translucent material may comprise plural materials.

It is preferred that at least one of the mold substrate and the master mold is made of a material transmitting at least 40% of light having a wavelength which interacts with the photo-acid generator and the photo radical polymerization initiator.

(Step (a))

The method of disposing the curable composition for imprinting on the surface of the mold substrate may, for example, be an inkjet method, a potting method (dispensing method), a spin coating method, a roll coating method, a casting method, a dip coating method, a die coating method, a Langmuir-Blodgett method or a vacuum deposition method.

The curable composition for imprinting may be placed on the entire surface of the mold substrate or may be placed on a part of the surface of the mold substrate.

The pressing pressure (gauge pressure) for pressing the master mold on the curable composition for imprinting is preferably from higher than 0 to at most 10 MPa, more preferably from 0.1 to 5 MPa.

The temperature at the time of pressing the master mold on the curable composition for imprinting is preferably from 0 to 110° C., more preferably from 10 to 80° C.

In the step (a), positioning of the master mold and the mold substrate may be conducted by an alignment mark.

(Step (b))

The curable composition for imprinting is cured by light irradiation.

As the method for applying light, a method of applying light from the master mold site by using a master mold made of a translucent material, a method of applying light from the mold substrate side by using a mold substrate made of a translucent material or a method of applying light from a gap between the master mold and the mold substrate, may be mentioned. The wavelength of light is preferably from 200 to 500 nm. At the time of applying light, the curable composition for imprinting may be heated for accelerating curing.

The temperature at the time of applying light is preferably from 0 to 110° C., more preferably from 10 to 80° C.

(Step (c))

The temperature at the time of separating a cured product layer from the master mold is preferably from 0 to 110° C., more preferably 10 to 80° C.

In the above-described process for producing a replica mold for imprinting of the present invention, the curable composition for imprinting of the present invention is cured to form a cured product layer, whereby a replica mold which is excellent in the adhesion of a cured product layer to the mold substrate and the release property from a cured product of a transfer object material when used in an imprinting method, can be produced.

<Article Having Fine Pattern on its Surface>

An article having a fine pattern on its surface obtained by the process for producing an article having a fine pattern on its surface of the present invention, has a substrate and a cured product layer having a fine pattern on its surface, formed on a surface of the substrate.

The article having a fine pattern on its surface has a cured product layer made of a cured product of a transfer object material.

Figure 3:
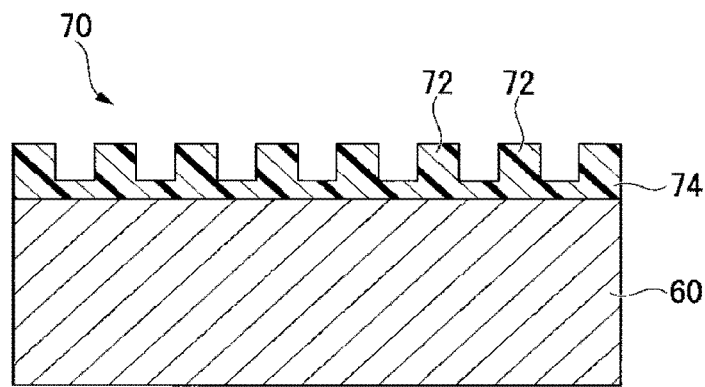
FIG. 3 is a schematic cross-sectional view illustrating one example of an article having a fine pattern on its surface.

FIG. 3 is a schematic cross-sectional view illustrating one example of an article having a fine pattern on its surface.

An article 70 having a fine pattern on its surface has a substrate 60 and a cured product layer 72 having a fine pattern 74 on its surface formed as the outermost layer on a surface of the substrate 60.

(Substrate)

As the substrate, a substrate made of an inorganic material or a substrate made of an organic material may be mentioned.

The inorganic material and the organic material may be the same material described in the above mold substrate.

(Cured Product Layer)

The cured product layer is a layer made of a cured product of a transfer object material.

The cured product layer has a fine pattern having either or both of plural convexes and plural concaves on its surface. The fine pattern is a reversed pattern corresponding to the fine pattern of the replica mold for imprinting of the present invention.

(Transfer Object Material)

As the transfer object material, a curable composition may be mentioned. As the curable composition, one containing either one or both of a curable resin and a curable monomer, and a photo-initiator may be mentioned.

As the curable resin, the curable monomer and the photo-initiator, known ones may be mentioned.

As the curable composition, a commercially available one for imprinting may be used.

<Process for Producing an Article Having a Fine Pattern on its Surface>

The process for producing an article having a fine pattern on its surface of the present invention has the following steps (α) to (γ).

Figure 4:
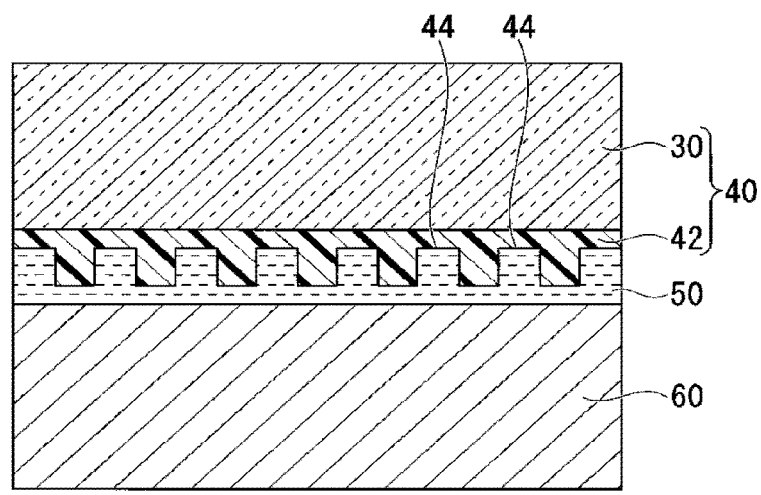
FIG. 4 is a schematic cross-sectional view illustrating one example of a process for producing an article having a fine pattern on its surface of the present invention.

Step (α): A step of sandwiching a transfer object material 50 between a replica mold 40 for imprinting of the present invention having a fine pattern 44 on its surface and a substrate 60 so that the fine pattern 44 of the replica mold 40 for imprinting is in contact with the transfer object material 50, as illustrated in FIG. 4.

Step (β): A step of curing the transfer object material to form a cured product layer.

Step (γ): A step of separating the cured product layer from the replica mold for imprinting.

(Step (α) to (γ))

The steps (α) to (γ) may be carried out in the same manner as in the steps (a) to (c) in the process for producing a replica mold for imprinting of the present invention.

In the above-described process for producing an article having a fine pattern on its surface of the present invention, the replica mold for imprinting of the present invention is used, whereby peeling of the cured product layer from the mold substrate in the replica mold for imprinting is suppressed, and the release property of the cured product layer from the transfer object material in the replica mold for imprinting is excellent.

EXAMPLES

Now, the present invention will be described in detail with reference to Examples. However, it should be understood that the present invention is by no means restricted to such specific Examples. Ex. 1 to 13 are Examples of the present invention, and Ex. 14 to 18 are Comparative Examples.
<Physical Properties and Evaluations>
(Mass Average Molecular Weight of Polymer)

The mass average molecular weight of a polymer was measured by means of the following apparatus under the following conditions.

GPC system: HLC-8220GPC (manufactured by Tosoh Corporation),

Column: TSK guard Column Super MZ-L, TSK gel HZ4000, TSK gel HZ3000, TSK gel HZ2500 and TSK gel HZ2000 (connected in this order and used), Column oven temperature: 40° C., solvent: tetrahydrofuran, flow rate: 0.35 mL/min, standard sample: polystyrene.
(Viscosity of Curable Composition)

A dynamic viscoelasticity of a curable composition was measured by means of a dynamic viscoelasticity measuring apparatus (Physica MCR301, manufactured by Anton Paar) at a shear rate of 10 $s^{-1}$ at 25° C. as the viscosity of the curable composition.
(Preparation of Test Specimen for Evaluation]

A surface of a quartz glass substrate (corresponding to the master mold) subjected to release treatment was coated with a curable composition, and on a part which was not coated with the curable composition, a PET (polyethylene terephthalate) film having a thickness of 100 μm was placed as a spacer. A slide glass substrate (corresponding to the mold substrate) not subjected to release treatment was overlaid on the surface of the curable composition, UV was applied at an exposure amount of 1,000 mJ/cm$^2$ by a high pressure mercury lamp from the slide glass substrate side to form a cured product layer, and then the quartz glass substrate was peeled from the cured product layer. The surface of the cured product layer was washed with ethanol, dried and baked at 100° C. for 60 minutes to obtain a slide glass substrate (corresponding to the replica mold) having a cured product layer (thickness: 100 μm) having a flat surface.

3 Parts by mass of a photo radical polymerization initiator (Irgacure (trade name) 1173, manufactured by BASF Japan) was added to 100 parts by mass of tricyclodecane dimethanol diacrylate (NK EsterA-DCP, manufactured by Shin-Nakamura Chemical Co., Ltd.) to prepare a transfer object material.

The surface of the cured product layer was coated with the transfer object material. A quartz glass substrate subjected to release treatment was overlaid on the surface of the transfer object material via a spacer of a PET film having a thickness of 50 μm, followed by applying UV at an exposure amount of 1,000 mJ/cm$^2$ by a high pressure mercury lamp from the quartz glass substrate side to form a cured product of the transfer object material, and then the quartz glass substrate was peeled from the cured product of the transfer object material. The surface of the cured product of the transfer object material was washed with ethanol, dried and then baked at 125° C. for 15 minutes to obtain a test specimen for evaluation having a layer made of the cured product of the transfer object material having a thickness of 50 μm on the surface of the cured product layer.
(Measurement of Peel Strength by PosiTest Tester)

A peel strength measuring terminal (dolly) was jointed to a surface of a cured product of a transfer object material with a two component mixed epoxy type instant adhesive (Araldite (trade name) Rapid, manufactured by Huntsman Advanced Materials Japan K.K.), the extra adhesive protruding from the joint surfaces was removed, followed by curing for 24 hours to bond the cured product of the transfer object material and the dolly. After the adhesive was solidified, the cured product of the transfer object material and the cured product layer were cut by a dedicated cutter along the dolly until reaching the slide glass substrate so that the joint surface between the dolly and the cured product of the transfer object material would be 3.14 cm$^2$.

Regarding the test specimen for evaluation having the dolly bonded, the peel strength at an interface between the cured product of the transfer object material and the cured product layer or an interface between the cured product layer and the slide glass substrate was measured by means of a PosiTest tester (manufactured by DeFelsko Corporation) in accordance with ASTM D4541 (ISO4624). The dolly of the test specimen for evaluation was connected to an actuator of the PosiTest tester with a jig for fixing a dolly, then pressure was applied by a pump to measure peel load until the cured product of the transfer object material or the cured product layer at the dolly part was peeled (dolly size: 20 mmφ, resolution: ±0.01 MPa, accuracy: +1%, measuring range: from 0 to 20 MPa). Then, the peeled states of the peeled cured product of the transfer object material and the peeled cured product layer were examined and evaluated by the following standard.

Good (○): The cured product layer remained on the entire surface of the slide glass substrate without floating, and the cured product of the transfer object material did not remain at all on the surface of the cured product layer.

Poor (x): The cured product of the transfer object material remained on the surface of the cured product layer even only a part; the cured product layer floated from the surface of the slide glass substrate; nothing remained on the surface of the slide glass substrate; or the slide glass substrate was broken.
(Preparation of Cured Product Having a Thickness of 3 mm)

A surface of a quartz glass substrate subjected to release treatment was coated with the curable composition, and on a part not coated with the curable composition, a silicone rubber having a thickness of 3 mm as a spacer was placed. A slide glass substrate not subjected to release treatment was overlaid on the surface of the curable composition, UV was applied at an exposure amount of 1,000 mJ/cm$^2$ by a high pressure mercury lamp from the slide glass substrate side to form a cured product layer, and then the cured product layer was peeled from the quartz glass substrate. The surface of the cured product layer was washed with ethanol, dried and baked at 100° C. for 60 minutes to obtain a slide glass substrate having a cured product layer (thickness: 3 mm) having a flat surface.

When coating a surface of a quartz glass substrate subjected to release treatment with a curable composition, if the viscosity of the curable composition is low, the composition spreads on the quartz glass substrate, and the height of the curable composition becomes lower than the height of a silicon rubber spacer. In such a case, by also coating a slide glass substrate with the curable composition, laminating the slide glass substrate on the quartz glass substrate so as to laminate the curable compositions each other and applying UV, a cured product having a thickness of 3 mm can be obtained.

<Materials>

(Monomer (I))

Monomer (I-1): 3,3,4,4,5,5,6,6,7,7,8,8,8-tridecafluorooctylmethacrylate (manufactured by Asahi Glass Company, Limited).

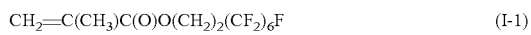

(Monomer (II))

Monomer (II-1): (3-ethyloxetan-3-yl)methyl methacrylate (OXE-30, manufactured by Osaka Organic Chemical Industry, Ltd.).

Monomer (II-2): 3,4-epoxycyclohexylmethyl methacrylate (Cyclomer M100, manufactured by DAICEL Corporation)

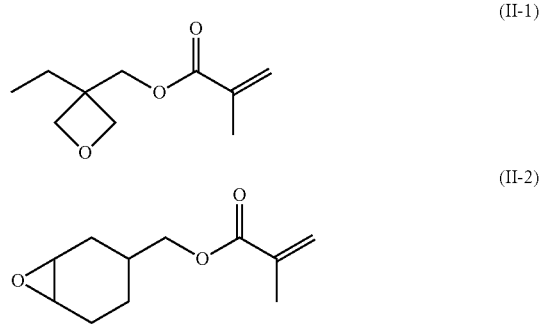

Preparation of Monomer (II-3):
4-hydroxybutylmethacrylate glycidyl ether

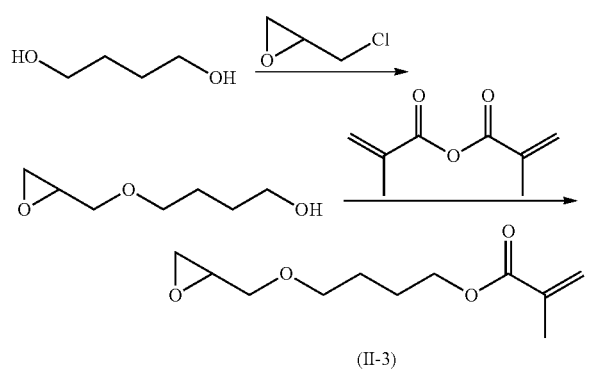

(II-3)

123.0 g of 1,4-butanediol and 500.0 g of epichlorohydrin were charged in a 1 L three necked flask, and the pressure was reduced to 150 mmHg while stirring. While maintaining the internal temperature at from 61 to 65° C., 120 g of a 48% sodium hydroxide aqueous solution was dropwise added over 4 hours, and after the termination of the dropwise addition, stirring was carried out for 1 hour. While that, the distilled aqueous layer was removed once every hour, and the organic layer was returned to the reaction liquid to continue the reaction. The temperature was returned to room temperature, 300 g of deionized water was added, followed by stirring for 30 minutes, and then the aqueous layer was extracted. Unreacted epichlorohydrin was removed by a rotary evaporator, followed by extracting one time with toluene and two times with ethyl acetate and purifying by silica gel column chromatography (developing solvent: ethyl acetate/hexane=1/1) to obtain 75.7 g of 4-(2,3-epoxypropoxy)butanol. 30.0 g of 4-(2,3-epoxypropoxy)butanol, 31.3 g of triethylamine and 100 mL of tetrahydrofuran were charged in a 500 mL three necked flask, followed by cooling to at most 10° C. in an ice bath with stirring. 38.2 g of methacrylic acid anhydride was dropwise added over 5 minutes, followed by stirring for 1 hour at 10° C. or below, the temperature was returned to room temperature, followed by stirring overnight. 100 mL of diethyl ether and 100 mL of a saturated ammonium chloride aqueous solution were added, followed by stirring for 30 minutes. Then, the organic layer was extracted and washed with saturated saline solution, saturated sodium bicarbonate water and saturated saline solution in this order, and then purification was carried out by silica gel column chromatography (developing solvent: ethyl acetate/hexane=1/10) to obtain 20.3 g of monomer (II-3). The obtained monomer (II-3) was identified by $^1$H-NMR.

$^1$H-NMR (acetone-d6, tetramethylsilane (TMS), 300 MHz): 6.05 (s, 1H of C(CH$_3$)=CH$_2$), 5.59 (s, 1H of C(CH$_3$)=CH$_2$), 4.14 (t, 2H of CH$_2$—O—CO), 3.68 (dd, 1H of O—CH$_2$—CH(O)CH$_2$), 3.50 (q, 2H of CH$_2$—CH$_2$—O—CH$_2$), 3.28 (dd, 1H of O—CH$_2$—CH(O)CH$_2$), 3.05 (m, 1H of CH(O)CH$_2$), 2.69 (dd, 1H of CH(O)CH$_2$), 2.51 (dd, 1H of CH(O)CH$_2$), 1.90 (s, 3H of C(CH$_3$)=CH$_2$), 1.70 (m, 4H of CH$_2$—CH$_2$—CH$_2$—CH$_2$)

(Monomer (III'))

Monomer (III'-1): 2-hydroxyethyl methacrylate (manufactured by Tokyo Chemical Industry Co., Ltd.).

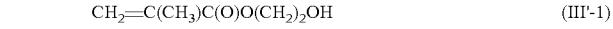

Monomer (III'-2): α-thioglycerol (manufactured by Tokyo Chemical Industry Co., Ltd.).

(Monomer (X))

Monomer (X-1): methacryloyloxyethoxyethyl isocyanate (Karenz MOI-EG (trade name), manufactured by Showa Denko K.K.).

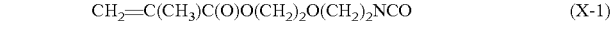

(Heat Polymerization Initiator)

Heat polymerization initiator: 2,2'-azobis(2,4-dimethylvaleronitrile) (manufactured by Tokyo Chemical Industry Co., Ltd.).

(Fluorinated Monomer)

Monomer (F-1): 3,3,4,4,5,5,6,6,7,7,8,8,8-tridecafluorooctylmethacrylate (manufactured by Asahi Glass Company, Limited) (the same as the monomer (I-1)).

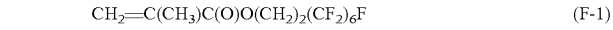

Preparation of Monomer (F-2): 1H,1H,8H,8H-dodecafluoro-1,8-octanediol diacrylate

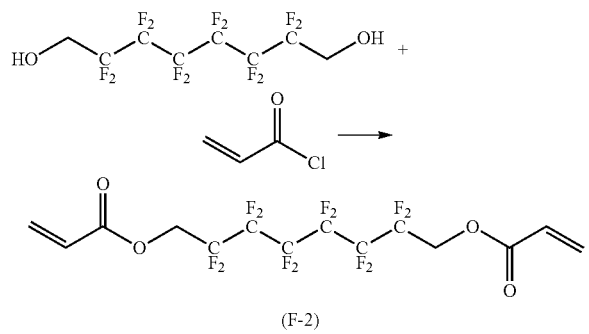

(F-2)

90.0 g of 1H,1H,8H,8H-dodecafluoro-1,8-octanediol, 55.3 g of triethylamine and 1,200 mL of tetrahydrofuran were charged in a 1 L three necked flask, followed by cooling to at most 10° C. in an ice bath with stirring. 49.5 g of acryloyl chloride was dropwise added over 2 hours, followed by stirring for 5 hours at 10° C. or below, the temperature was returned to room temperature, followed by stirring overnight. Tetrahydrofuran was distilled off, and 300 mL of hydrochloric acid (1M) and 300 mL of ethyl acetate were added, followed by stirring for 30 minutes. Then, the organic layer was extracted and washed with saturated saline solution, saturated baking soda water and saturated saline solution in this order. Ethyl acetate was distilled off from the organic layer, and the resulting liquid was purified by a silica gel column (developing solvent: ethyl acetate/hexane=1/4) to obtain 95.9 g of colorless transparent monomer (F-2). The yield was 82%. The obtained monomer (F-2) was identified by $^1$H-NMR.

$^1$H-NMR (chloroform-d1, tetramethylsilane (TMS), 300 MHz):6.52 (d, 2H of CH=CH$_2$), 6.17 (dd, 2H of CH=CH$_2$), 5.98 (d, 2H of CH=CH$_2$), 4.66 (t, 4H of CH$_2$).

Preparation of Monomer (F-3): 1H,1H,2H,2H,9H,9H,10H,10H-dodecafluoro-1,10-decanediol diacrylate

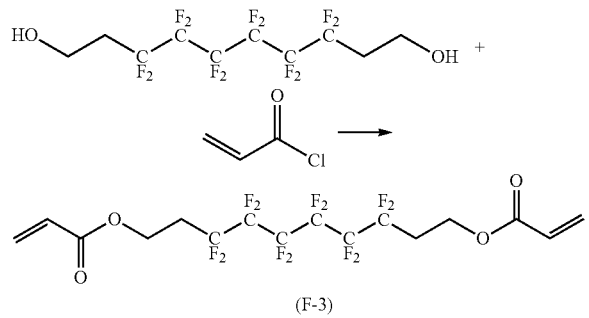

(F-3)

20.0 g of 1H,1H,2H,2H,9H,9H,10H,10H-dodecafluoro-1,10-decanediol, 11.4 g of triethylamine and 250 mL of tetrahydrofuran were charged in a 1 L three necked flask, followed by cooling to at most 10° C. in an ice bath with stirring. 10.2 g of acryloyl chloride was dropwise added over 30 minutes, followed by stirring for 3 hours at 10° C. or below, the temperature was returned to room temperature, followed by stirring overnight. 200 mL of hydrochloric acid (1M) and 100 mL of ethyl acetate were added, followed by stirring for 30 minutes. Then, the organic layer was extracted and washed with saturated saline solution, saturated baking soda water and saturated saline solution in this order. Ethyl acetate was distilled off from the organic layer, and the resulting liquid was purified by a silica gel column (developing solvent: ethyl acetate/hexane=1/4) to obtain 19.1 g of colorless transparent monomer (F-3). The yield was 75%. The obtained monomer (F-3) was identified by $^1$H-NMR.

$^1$H-NMR (acetone-d6, tetramethylsilane (TMS), 300 MHz): 6.41 (d, 2H of CH=CH$_2$), 6.16 (dd, 2H of CH=CH$_2$), 5.91 (d, 2H of CH=CH$_2$), 4.50 (t, 4H of O—CH$_2$), 2.67 (t, 4H of CH$_2$—CF$_2$).

Preparation of Monomer (F-4): 1H,1H,10H,10H-hexadecafluoro-1,10-decanediol diacrylate

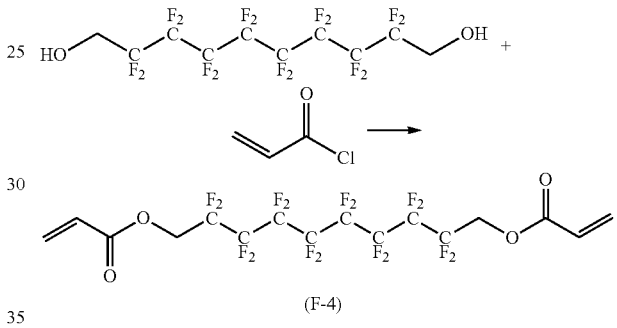

(F-4)

20.0 g of 1H,1H,10H,10H-hexadecafluoro-1,10-decanediol, 9.6 g of triethylamine and 100 mL of tetrahydrofuran were charged in a 1 L three necked flask, followed by cooling to at most 10° C. in an ice bath with stirring. 8.0 g of acryloyl chloride was dropwise added over 30 minutes, followed by stirring for 3 hours at 10° C. or below, the temperature was returned to room temperature, followed by stirring overnight. 200 mL of hydrochloric acid (1M) and 100 mL of ethyl acetate were added, followed by stirring for 30 minutes. Then, the organic layer was extracted and washed with saturated saline solution, saturated baking soda water and saturated saline solution in this order. Ethyl acetate was distilled off from the organic layer, and the resulting liquid was purified by a silica gel column (developing solvent: ethyl acetate/hexane=1/4) to obtain 21.9 g of colorless transparent monomer (F-4). The yield was 89%. The obtained monomer (F-4) was identified by $^1$H-NMR.

$^1$H-NMR (chloroform-d 1, tetramethylsilane (TMS), 300 MHz): 6.51 (d, 2H of CH=CH$_2$), 6.16 (dd, 2H of CH=CH$_2$), 5.96 (d, 2H of CH=CH$_2$), 4.65 (t, 4H of CH$_2$).

Preparation of Monomer (F-5): 1H,1H,6H,6H-octafluoro-1,6-hexanediol diacrylate

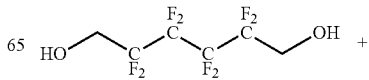

-continued

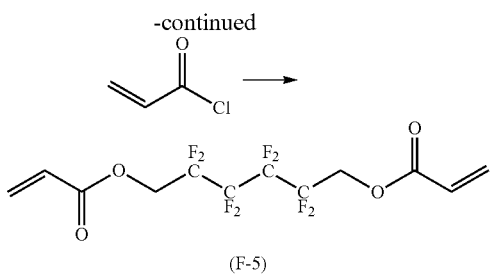

(F-5)

15.0 g of 1H,1H,6H,6H-octafluoro-1,6-hexanediol, 12.7 g of triethylamine and 100 mL of tetrahydrofuran were charged in a 1 L three necked flask, followed by cooling to at most 10° C. in an ice bath with stirring. 10.6 g of acryloyl chloride was dropwise added over 30 minutes, followed by stirring for 3 hours at 10° C. or below, the temperature was returned to room temperature, followed by stirring overnight. 200 mL of hydrochloric acid (1M) and 100 mL of ethyl acetate were added, followed by stirring for 30 minutes. Then, the organic layer was extracted and washed with saturated saline solution, saturated baking soda water and saturated saline solution in this order. Ethyl acetate was distilled off from the organic layer, and the resulting liquid was purified by a silica gel column (developing solvent: ethyl acetate/hexane=1/4) to obtain 15.9 g of colorless transparent monomer (F-5). The yield was 75%. The obtained monomer (F-5) was identified by $^1$H-NMR.

$^1$H-NMR (chloroform-d 1, tetramethylsilane (TMS), 300 MHz): 6.51 (d, 2H of CH=CH$_2$), 6.19 (dd, 2H of CH=CH$_2$), 5.98 (d, 2H of CH=CH$_2$), 4.65 (t, 4H of CH$_2$).

(Non-Fluorinated Monomer)

Monomer (M-1): Tricyclodecanedimethanol diacrylate (NK Ester A-DCP, manufactured by Shin-Nakamura Chemical Co., Ltd.).

Monomer (M-2): Isobornyl acrylate (Light acrylate IB-XA, manufactured by Kyoeisha Chemical Co., Ltd.)

Monomer (M-3): Polyethylene glycol diacrylate (NK Ester A-200, manufactured by Shin-Nakamura Chemical Co., Ltd.)

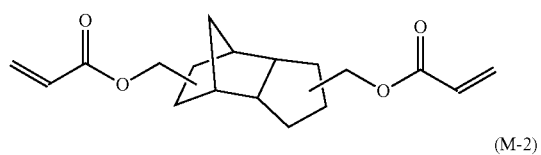
(M-1)

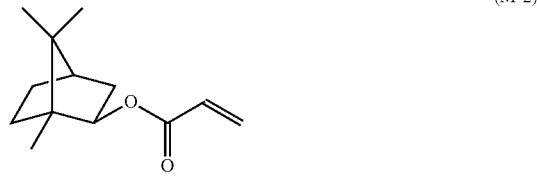
(M-2)

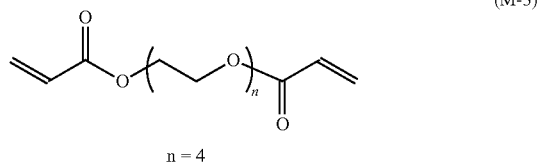
(M-3)

n = 4

(Photo-Acid Generator)

(P-1): Triaryl sulfonium salt type photo-acid generator (CPI-210S, manufactured by San-Apro Ltd.).

(P-2): tri-p-tolylsulfonium trifluoromethanesulfonate (manufactured by Tokyo Chemical Industry Co., Ltd.).

(Photo-Radical Polymerization Initiator)

2-hydroxy-2-methylpropiophenone (manufactured by Tokyo Chemical Industry Co., Ltd.).

Preparation of Fluorinated Polymer (A)

Preparation Example 1

Preparation of Fluorinated Polymer (A-1):

31.6 g of monomer (I-1), 13.5 g of monomer (II-1), 0.54 g of a heat polymerization initiator and 405 g of 2-butanone (MEK) were charged in a two necked flask provided with a reflux condenser and a nitrogen introduction tube, followed by replacement with nitrogen, heating to 50° C. and stirring for 24 hours. The consumption of the monomers was confirmed by thin layer chromatography (TLC), and then the temperature was raised to 70° C., followed by stirring for 30 minutes. After concentration until the total amount became 100 g, the temperature was cooled to room temperature, and the obtained reaction liquid was added in 1 L of methanol to precipitate and recover a solid. Then, the obtained solid was dissolved in 15 g of MEK, 1 L of methanol was added thereto to precipitate the solid again and recover it, followed by vacuum drying to obtain fluorinated polymer (A-1). Results are shown in Tables 1 and 2.

Preparation Example 2

Preparation of Fluorinated Polymer (A-2):

Fluorinated polymer (A-2) was obtained in the same manner as in Preparation Example 1, except that the amount of the monomer (I-1) was changed to 30.9 g, 14.1 g of monomer (II-2) was used instead of the monomer (II-1), and the amount of the heat polymerization initiator was changed to 0.53 g. Results are shown in Tables 1 and 2.

Preparation Example 3

Preparation of Fluorinated Polymer (A-3):

Fluorinated polymer (A-3) was obtained in the same manner as in Preparation Example 1, except that the amount of the monomer (I-1) was changed to 30.1 g, 14.9 g of monomer (II-3) was used instead of the monomer (II-1), and the amount of the heat polymerization initiator was changed to 0.52 g. Results are shown in Tables 1 and 2.

Preparation Example 4

Preparation of Fluorinated Polymer (A-4):

30.0 g of monomer (I-1), 14.9 g of monomer (II-1), 4.5 g of monomer (III'-1), 5.0 g of monomer (III'-2), 0.57 g of a heat polymerization initiator and 127 g of MEK were charged in a two necked flask provided with a reflux condenser and a nitrogen introduction tube, followed by replacement with nitrogen, heating to 50° C. and stirring for 24 hours. The consumption of the monomers was confirmed by thin layer chromatography (TLC), and then the temperature was raised to 70° C., followed by stirring for 30 minutes. After concentration until the total amount became 100 g, the temperature was cooled to room temperature. The obtained reaction liquid was added in 1 L of hexane to precipitate and recover a viscous product. Further, the obtained viscous product was dissolved in 15 g of MEK, the solution was added in 1 L of hexane to precipitate and recover the viscous product again. The viscous product was vacuum dried to obtain a precursor of fluorinated polymer (A-4). The mass average molecular weight (Mw) was 1,900.

45.0 g of the precursor of the fluorinated polymer (A-4), 6.6 mg of dibutyltin dilaurate (DBTDL), 185 mg of dibutylhydroxytoluene (BHT), 21.0 g of monomer (X-1) and 255 g of MEK were charged in a two necked flask provided with a reflux condenser and a nitrogen introduction tube, followed by replacement with nitrogen, heating to 40° C. and stirring for 24 hours. As the disappearance of a peak (in the vicinity of 2,250 cm$^{-1}$) derived from the isocyanate by FT-IR is an index, the consumption of the monomer (X-1) was confirmed. Then, the temperature was raised to 70° C., followed by stirring for 30 minutes. After concentration until the total amount became 100 g, the temperature was cooled to room temperature, and the obtained reaction liquid was added in 1 L of hexane to precipitate and recover a viscous product. Further, the obtained viscous product was dissolved in 15 g of MEK, and the solution was added in 1 L of hexane to precipitate and recover the viscous product again. The viscous product was vacuum dried to obtain fluorinated polymer (A-4). Results are shown in Tables 1 and 2.

Preparation Example 5

Preparation of Fluorinated Polymer (A-5):

A precursor of fluorinated polymer (A-5) was obtained in the same manner as in Preparation Example 4, except that 15.9 g of monomer (II-2) was used instead of the monomer (II-1). The mass average molecular weight (Mw) was 2,000.

Fluorinated polymer (A-5) was obtained in the same manner as in Preparation Example 4, except that instead of the precursor of the fluorinated polymer (A-4), 45.0 g of the precursor of the fluorinated polymer (A-5) was used, the amount of DBTDL was changed to 6.5 mg, the amount of BHT was changed to 182 mg, and the amount of the monomer (X-1) was changed to 20.6 g. Results are shown in Tables 1 and 2.

Preparation Example 6

Preparation of Fluorinated Polymer (A-6):

A precursor of fluorinated polymer (A-6) was obtained in the same manner as in Preparation Example 4, except that instead of the monomer (II-1), 15.9 g of monomer (II-2) was used, the amount of the monomer (III'-1) was change to 7.5 g, the amount of the monomer (III'-2) was changed to 2.5 g, the amount of the heat polymerization initiator was changed to 0.29 g, and the amount of MEK was changed to 131 g. The mass average molecular weight (Mw) was 3,100.

Fluorinated polymer (A-6) was obtained in the same manner as in Preparation Example 4, except that instead of the precursor of the fluorinated polymer (A-4), 46.7 g of the precursor of the fluorinated polymer (A-6) was used, the amount of DBTDL was changed to 11 mg, the amount of BHT was changed to 153 mg, the amount of the monomer (X-1) was changed to 17.3 g, and the amount of MEK was changed to 265 g. Results are shown in Tables 1 and 2.

Preparation Example 7

Preparation of Fluorinated Polymer (A-7):

Fluorinated polymer (A-7) was obtained in the same manner as in Preparation Example 1, except that the amount of the monomer (I-1) was changed to 35.0 g, the amount of the monomer (II-1) was changed to 10.0 g, and the amount of the heat polymerization initiator was changed to 0.50 g. Results are shown in Tables 1 and 2.

Preparation Example 8

Preparation of Fluorinated Polymer (A-8):

A precursor of fluorinated polymer (A-8) was obtained in same manner as in Preparation Example 4, except that instead of 14.9 g of the monomer (II-1), 12.1 g of monomer (II-2) was used, the amount of the monomer (III'-1) was changed to 5.5 g, the amount of the monomer (III'-2) was changed to 2.1 g, and the amount of the heat polymerization initiator was changed to 0.24 g. The mass average molecular weight (Mw) was 2,000.

Fluorinated polymer (A-8) was obtained in the same manner as in Preparation Example 4, except that instead of the precursor of the fluorinated polymer (A-4), 40.0 g of the precursor of the fluorinated polymer (A-8) was used, the amount of DBTDL was changed to 4.1 mg, the amount of BHT was changed to 115 mg, and the amount of the monomer (X-1) was changed to 13.0 g. Results are shown in Tables 1 and 2.

Preparation Example 9

Preparation of Fluorinated Polymer (A-9):

Fluorinated polymer (A-9) was obtained in the same manner as in Preparation Example 1, except that the amount of the monomer (I-1) was changed to 18.0 g, the amount of the monomer (II-1) was changed to 22.0 g, and the amount of the heat polymerization initiator was changed to 0.58 g. Results are shown in Tables 1 and 2.

TABLE 1

| | Charged amount | | | | | | |
|---|---|---|---|---|---|---|---|
| Preparation Example | Monomer (I-1) mass % | Monomer (II) Type | Monomer (II) mass % | Monomer (III'-1) mass % | Monomer (III'-2) mass % | Monomer (X-1) parts by mass *1 | Heat polymerization initiator mol % *2 |
| 1 | 70 | (II-1) | 30 | — | — | — | 1.5 |
| 2 | 69 | (II-2) | 31 | — | — | — | 1.5 |
| 3 | 67 | (II-3) | 33 | — | — | — | 1.5 |
| 4 | 55 | (II-1) | 27 | 8.3 | 9.2 | 47 | 1.0 |
| 5 | 54 | (II-2) | 29 | 8.1 | 9.0 | 46 | 1.0 |
| 6 | 54 | (II-2) | 28 | 13 | 4.4 | 37 | 0.5 |

TABLE 1-continued

| | Charged amount | | | | | | |
|---|---|---|---|---|---|---|---|
| Preparation Example | Monomer (I-1) mass % | Monomer (II) Type | Monomer (II) mass % | Monomer (III'-1) mass % | Monomer (III'-2) mass % | Monomer (X-1) parts by mass *1 | Heat polymerization initiator mol % *2 |
| 7 | 78 | (II-1) | 22 | — | — | — | 1.5 |
| 8 | 60 | (II-2) | 24 | 11 | 4.2 | 46 | 0.5 |
| 9 | 45 | (II-1) | 55 | — | — | — | 1.5 |

*1 The sum of the parts by mass per 100 parts by mass of the monomers (I), (II) and (III') in total corresponding to the amount of substance ×1 of the monomer (III'-1) and the parts by mass per 100 parts by mass of the monomers (I), (II) and (III') corresponding to the material amount ×2 of the monomer (III'-2)
*2 The material amount per the total mass of the monomers (I), (II) and (III')

TABLE 2

| | Fluorinated polymer (A) | | | | |
|---|---|---|---|---|---|
| Preparation Example | Structural units (a) parts by mass | Structural units (b) parts by mass | Structural units (c) parts by mass | Fluorine content mass % | Mass average molecular weight (Mw) |
| 1 | 100 | 42.9 | — | 40.0 | 23,000 |
| 2 | 100 | 44.9 | — | 39.4 | 23,000 |
| 3 | 100 | 49.3 | — | 38.3 | 24,000 |
| 4 | 100 | 50.0 | 116 | 21.5 | 2,400 |
| 5 | 100 | 53.0 | 116 | 21.2 | 2,500 |
| 6 | 100 | 53.0 | 103 | 22.4 | 4,800 |
| 7 | 100 | 28.2 | — | 44.6 | 26,000 |
| 8 | 100 | 40.4 | 79.1 | 26.0 | 4,600 |
| 9 | 100 | 122 | — | — | 34,000 |

Ex. 1 to 18

The respective components mentioned in Table 3 were blended in accordance with the blending composition (numerical values are represented by mass %), stirred and mixed by a mix rotor to obtain a uniform transparent curable composition. Evaluation results are shown in Table 4.

TABLE 3

| | Fluorinated polymer (A) | | Fluorinated monomer | | Non-fluorinated monomer | | | Photo-radical polymerization initiator | Photo-acid generator | |
|---|---|---|---|---|---|---|---|---|---|---|
| Ex. | Type | mass % | Type | mass % | (M-3) mass % | (M-2) mass % | (M-3) mass % | parts by mass *1 | Type | parts by mass *1 |
| 1 | (A-1) | 30 | (F-2) | 70 | — | — | — | 1.0 | (P-1) | 0.5 |
| 2 | (A-1) | 48 | (F-2) | 52 | — | — | — | 1.0 | (P-1) | 0.5 |
| 3 | (A-1) | 30 | (F-3) | 70 | — | — | — | 1.0 | (P-1) | 0.5 |
| 4 | (A-2) | 30 | (F-4) | 70 | — | — | — | 1.0 | (P-2) | 0.5 |
| 5 | (A-3) | 30 | (F-2) | 70 | — | — | — | 1.0 | (P-1) | 0.5 |
| 6 | (A-4) | 60 | (F-4) | 40 | — | — | — | 0.8 | (P-1) | 0.5 |
| 7 | (A-5) | 60 | (F-4) | 40 | — | — | — | 0.8 | (P-1) | 0.5 |
| 8 | (A-5) | 60 | (F-1) | 10 | 10 | 6 | 14 | 0.8 | (P-1) | 0.5 |
| 9 | (A-6) | 60 | (F-1) | 10 | 10 | 6 | 14 | 0.8 | (P-1) | 0.5 |
| 10 | (A-7) | 15 | (F-2) | 85 | — | — | — | 1.0 | (P-1) | 0.5 |
| 11 | (A-8) | 15 | (F-1) | 2.5 | 1.0 | 1.5 | 80 | 0.8 | (P-1) | 0.5 |
| 12 | (A-8) | 15 | (F-5) | 13 | 32 | 40 | — | 0.8 | (P-1) | 0.5 |
| 13 | (A-9) | 15 | (F-2) | 50 | 20 | 15 | — | 0.8 | (P-1) | 0.5 |
| 14 | (A-7) | 10 | (F-2) | 90 | — | — | — | 1.0 | (P-1) | 0.5 |
| 15 | (A-8) | 10 | (F-1) | 2.5 | 2.5 | 1.0 | 84 | 0.8 | (P-1) | 0.5 |
| 16 | (A-8) | 10 | (F-5) | 13 | 37 | 40 | — | 0.8 | (P-1) | 0.5 |
| 17 | (A-3) | 10 | (F-1) | 1.5 | 1 | 2.5 | 85 | 0.8 | (P-1) | 0.5 |
| 18 | (A-3) | 5 | (F-1) | 1.5 | 5 | 3.5 | 85 | 0.8 | (P-1) | 0.5 |

TABLE 4

| Ex | Curable monomer Fluorine content (%) | Curable composition Fluorine content (%) | Curable composition Viscosity (Pa·s) | Test specimen for evaluation Peel strength (MPa) | Test specimen for evaluation Evaluation of peeled state |
|---|---|---|---|---|---|
| 1 | 48.5 | 45.9 | 0.7 | 0.15 | ○ |
| 2 | 48.5 | 44.4 | 1.0 | 0.18 | ○ |
| 3 | 45.8 | 44.0 | 0.8 | 0.16 | ○ |
| 4 | 53.3 | 49.1 | 0.7 | 0.17 | ○ |
| 5 | 48.5 | 45.4 | 0.6 | 0.19 | ○ |
| 6 | 53.3 | 34.2 | 3.0 | 0.20 | ○ |
| 7 | 53.3 | 34.1 | 2.8 | 0.21 | ○ |
| 8 | 14.3 | 18.5 | 3.2 | 0.10 | ○ |
| 9 | 14.3 | 19.1 | 3.5 | 0.12 | ○ |
| 10 | 48.5 | 47.9 | 0.1 | 0.16 | ○ |
| 11 | 1.7 | 5.3 | 0.1 | 0.27 | ○ |
| 12 | 6.3 | 9.2 | 0.2 | 0.25 | ○ |
| 13 | 28.5 | 28.1 | 0.2 | 0.29 | ○ |
| 14 | 48.5 | 48.1 | 0.05 | 0.15 | x |
| 15 | 1.6 | 4.0 | 0.06 | 0.31 | x |
| 16 | 5.9 | 7.9 | 0.1 | 0.28 | x |
| 17 | 0.9 | 4.7 | 0.05 | — | — |
| 18 | 0.9 | 4.7 | 0.03 | 0.31 | x |

In Ex. 1 to 13, the adhesion to the mold substrate was high, and the release property from the cured product of the transfer object material was excellent, since at least 11 mass % of the fluorinated polymer (A) was contained.

In Ex. 14 to 16, the adhesion to the mold substrate was poor, and a part of the cured product layer was peeled from the surface of the slide glass substrate when measuring the peel strength, since the content of the fluorinated polymer (A) was at most 10 mass %.

In Ex. 17, the compatibility of the curable monomer and the fluorinated polymer (A) was poor, and they were incompatible with each other, even though the proportion of the fluorinated polymer (A) was 10 mass %, since the fluorine content of the curable monomer was less than 1 mass %. A test specimen for evaluation could not be prepared, since the compatibility was poor.

In Ex. 18, the content of the fluorinated polymer (A) had to be 5 mass % so that the curable monomer and the fluorinated polymer (A) would be compatible with each other, since the fluorine content of the curable monomer was less than 1 mass %. The adhesion to a mold substrate was poor, and the cured product layer was peeled from the surface of the slide glass substrate when measuring the peel strength, since the content of the fluorinated polymer (A) was at most 10 mass %.

In Ex. 1 to 5, 10 to 13 and 16, although the viscosity was at least 0.1 Pa·s, the viscosity was at most 1.0 Pa·s, and the curable composition easily spread. Thus, not only on the quartz glass substrate, the curable composition was also applied on the slide glass substrate, whereby a cured product having a thickness of 3 mm could be prepared.

In Ex. 6 to 9, a cured product having a thickness of 3 mm could be obtained by only applying the curable composition on a quartz glass substrate, since the viscosity was at least 2.0 Pa·s.

In Ex. 14, 15 and 18, the curable composition spread on the quartz glass substrate and also on the slide glass substrate, since the viscosity was less than 0.1 Pa·s. A cured product having a thickness of 3 mm could not be prepared even when the curable compositions were laminated each other.

INDUSTRIAL APPLICABILITY

The replica mold for imprinting of the present invention is useful as a mold for imprinting to be used for producing a substrate provided with a resist for an etching mask, etc. in the production of an optical element, an optical member for a display (such as an antireflection member or an anti-fingerprint member), a biochip, a microreactor chip, a recording medium, a catalyst carrier, a semiconductor device, etc.

MEANINGS OF SYMBOLS

10: master mold, 12: fine pattern, 20: curable composition for imprinting, 30: mold substrate, 40: replica mold for imprinting, 42: cured product layer, 44: fine pattern, 50: transfer object material, 60: substrate, 70: article having a fine pattern on its surface, 72: cured product layer, 74: fine pattern

What is claimed is:

1. A curable composition for imprinting, which comprises a fluorinated polymer comprising structural units (a) based on a monomer (I) represented by the following formula and structural units (b) having a cationic polymerizable reactive group having an oxygen atom (except the structural units (a)), and a photo-acid generator, wherein the proportion of the fluorinated polymer is from 11 to 89 mass % in 100 mass % of the curable composition for imprinting:

$$CH_2=C(R^1)C(O)OR^2R^f \quad (I)$$

wherein $R^1$ is a hydrogen atom, a methyl group or a halogen atom, $R^2$ is a bivalent linking group having no fluorine atom, $R^f$ is a $C_{2-6}$ fluoroalkyl group or a $C_{2-6}$ fluoroalkyl group having an etheric oxygen atom between carbon atoms, and in $R^f$, the carbon atom boned to $R^2$ has at least one fluorine atom.

2. The curable composition for imprinting according to claim 1, wherein the content of the structural units (h) is from 10 to 150 parts by mass, per 100 parts by mass of the structural units (a).

3. The curable composition for imprinting according to claim 1, wherein the fluorinated polymer has a mass average molecular weight of from 1,000 to 50,000.

4. The curable composition for imprinting according to claim 1, wherein the fluorinated polymer further has structural units (c) having a pendant group having an ethylenic double bond.

5. The curable composition for imprinting according to claim 1, which as a viscosity of at least 0.1 Pas at 25° C.

6. The curable composition for imprinting according to claim 1, wherein the fluorinated polymer has a fluorine content of at least 22 mass %.

7. The curable composition for imprinting according to claim which has a fluorine content of at least 5 mass %.

8. The curable composition for imprinting according to claim 1, wherein the curable composition for imprinting further contains a curable monomer, and the curable monomer includes a fluorinated monomer.

9. The curable composition for imprinting according to claim 8, wherein the curable monomer has a fluorine content of at least 1 mass %.

10. The curable composition for imprinting according to claim 1, wherein the cationic polymerizable reactive group reacts with a reactive group on a surface of a mold substrate by an acid generated from the photo-acid generator.

11. A replica mold for imprinting, which comprises a mold substrate and a cured product layer having a fine pattern on its surface, formed on a surface of the mold substrate, wherein the cured product layer is made of a cured product of the curable composition for imprinting as defined in claim 1.

12. The replica mold for imprinting according to claim 11, wherein the mold substrate is made of glass.

13. The replica mold for imprinting according to claim 11, wherein the mold substrate is made of quartz glass.

14. A process for producing the replica mold for imprinting as defined in claim 11, which comprises sandwiching the curable composition for imprinting between a master mold having a fine pattern on its surface and the mold substrate so that the fine pattern of the master mold is in contact with the curable composition for imprinting, curing the curable composition for imprinting to form a cured product layer, and separating the cured product layer from the master mold.

15. A process for producing an article having a fine pattern on its surface, comprising a substrate and a cured product layer having a fine pattern on its surface, formed on a surface of the substrate, which comprises sandwiching a transfer object material between the replica mold for imprinting as defined in claim 11 and the substrate so that the fine pattern of the replica mold for imprinting is in contact with the transfer object material, curing the transfer object material to form a cured product layer, and separating the cured product layer from the replica mold for imprinting.

* * * * *